US010868091B2

(12) United States Patent
Choi et al.

(10) Patent No.: US 10,868,091 B2
(45) Date of Patent: Dec. 15, 2020

(54) ORGANIC LIGHT-EMITTING DISPLAY

(71) Applicant: LG Display Co., Ltd., Seoul (KR)

(72) Inventors: Howon Choi, Paju-si (KR); Joonyoung Heo, Paju-si (KR)

(73) Assignee: LG Display Co., Ltd., Seoul (KR)

(*) Notice: Subject to any disclaimer, the term of this patent is extended or adjusted under 35 U.S.C. 154(b) by 2 days.

(21) Appl. No.: 16/204,254

(22) Filed: Nov. 29, 2018

(65) Prior Publication Data
US 2019/0181199 A1 Jun. 13, 2019

(30) Foreign Application Priority Data
Dec. 7, 2017 (KR) .................. 10-2017-0167325

(51) Int. Cl.
*H01L 27/32* (2006.01)
*H01L 51/52* (2006.01)

(52) U.S. Cl.
CPC ........ *H01L 27/3246* (2013.01); *H01L 27/322* (2013.01); *H01L 27/3258* (2013.01); *H01L 51/5218* (2013.01); *H01L 51/5253* (2013.01); *H01L 51/5271* (2013.01); *H01L 2227/323* (2013.01)

(58) Field of Classification Search
CPC ............... H01L 27/3246; H01L 27/322; H01L 51/5218; H01L 51/5271; H01L 51/5253; H01L 27/3258; H01L 2227/323
See application file for complete search history.

(56) References Cited

U.S. PATENT DOCUMENTS 7,586,124 B2    9/2009  Kim et al.
10,374,192 B2   8/2019  Hong et al.
2013/0009162 A1 1/2013  Kang
2014/0034921 A1 2/2014  Jinta et al.
2014/0312323 A1* 10/2014 Park ................. H01L 51/525
                                                     257/40
2016/0043341 A1 2/2016  Heo et al.

FOREIGN PATENT DOCUMENTS

| CN | 1866537 A | 11/2006 |
|---|---|---|
| EP | 1724854 A1 | 11/2006 |
| EP | 2854179 A2 | 4/2015 |
| JP | 2006-252839 A | 9/2006 |
| JP | 2006252839 * | 9/2006 |
| KR | 10-2013-0005877 A | 1/2013 |
| KR | 10-2013-0006068 A | 1/2013 |
| KR | 10-2016-0074778 A | 6/2016 |
| TW | 201640670 A | 11/2016 |

OTHER PUBLICATIONS

Extended European Search Report dated Apr. 24, 2019, issued in corresponding European Patent Application No. 18209712.1.
First Office Action issued in corresponding Taiwanese Patent Application No. 107142526, dated Nov. 7, 2019.

* cited by examiner

*Primary Examiner* — Matthew L Reames
(74) *Attorney, Agent, or Firm* — Morgan, Lewis & Bockius LLP

(57) ABSTRACT

An organic light-emitting display having pixels comprises a planarization layer disposed on transistors, first electrodes disposed on the planarization layer and individually allocated to the pixels, a stopper disposed on the planarization layer and placed between the first electrodes neighboring each other, and a pixel definition layer that has apertures exposing respectively at least a part of the first electrodes and grooves exposing at least a part of the stopper.

9 Claims, 9 Drawing Sheets

(a)

(b)

(a)

(b)

(a)

(b)

ORGANIC LIGHT-EMITTING DISPLAY

This application claims the benefit of Korean Patent Application No. 10-2017-0167325, filed on Dec. 7, 2017, which is incorporated herein by reference for all purposes as if fully set forth herein

BACKGROUND OF THE INVENTION

Field of the Invention

The present invention relates to an organic light-emitting display.

Related Art

Recently, various display devices that are less bulky and more lightweight than cathode ray tubes (CRTs) are being developed. Examples of these display devices include liquid crystal displays (LCDs), field emission displays (FEDs), plasma display panels (PDPs), organic light-emitting display devices (OLEDs), etc.

Of these display devices, organic light-emitting displays are self-emission displays that emit light through excitation of organic compounds. In contrast to LCDs, the organic light-emitting displays work without a backlight; thus, organic light-emitting displays can be more lightweight and thinner and made in a simplified process. Also, the organic light emitting displays are widely used because they can be manufactured at low temperatures, have a fast response time of 1 ms or less, and feature low power consumption, wide viewing angle, and high contrast.

An organic light-emitting display comprises pixels each having an organic light-emitting diode that converts electrical energy into light energy. The organic light-emitting diode comprises an anode, a cathode, and an organic compound layer situated between the anode and cathode. Holes and electrons are injected from the anode and cathode, respectively, and they recombine to form excitons, whereby the organic light-emitting display displays an image when the excitons fall from the excited state to the ground state.

The organic compound layer may comprise red (R), green (G), and blue (B) organic compound layers. They may be formed in corresponding red (R), green (G), and blue (B) pixels, respectively. A fine metal mask (FMM) is typically used to pattern the red (R), green (G), and blue (B) pixels. However, even with the dramatic advances in the processing technology, there are limitations in using the FMM to make high-resolution displays. As a matter of fact, when the FMM is used to realize resolution above 1,000 PPI, it is currently hard to achieve a process yield of more than a certain level.

Moreover, a large-area, high-resolution display device requires a corresponding large-area FMM. The larger the area of the mask, the more the center will sag under the weight, which leads to various defects such as displacement of the organic compound layer.

SUMMARY OF THE INVENTION

The present invention provides an organic light-emitting display that improves display quality by minimizing leakage current.

In one aspect, there is provided an organic light-emitting display having pixels. The organic light-emitting display comprises a planarization layer disposed on transistors, first electrodes disposed on the planarization layer and individually allocated to the pixels, a stopper disposed on the planarization layer and placed between the first electrodes neighboring each other, and a pixel definition layer that has apertures exposing respectively at least a part of the first electrodes and grooves exposing at least a part of the stopper.

The stopper directly contacts one side of the first electrode.

The stopper covers one side surface and at least a part of a top surface of the first electrode.

The stopper and the pixel definition layer have different etch selectivity from each other.

The stopper includes a material having an etching rate which is set lower than the etching rate of the pixel defining layer.

The stopper is composed of a single layer of inorganic material or multiple layers thereof.

The stopper is a single layer of one of the following: a silicon oxide film (SiOx), a silicon nitride film (SiNx), a silicon oxynitride (SiON), aluminum oxide (Al2O3), and titanium dioxide (TiO2), or multiple layers thereof.

The organic light-emitting display further comprises an organic compound layer covering the first electrodes and the pixel definition layer, and second electrode covering the organic compound layer.

The organic compound layer directly contacts the stopper via the grooves.

In another aspect, there is provided an organic light-emitting display comprising a planarization layer disposed on transistors; a sacrifice layer that has a first opening exposing at least a part of the planarization layer; a separating layer that disposes on the sacrifice layer, has a second opening narrower than the first opening, and has a groove exposing at least a part of the sacrifice layer; and a first electrode disposed on the planarization layer, the separating layer, and the grooves. The first electrode is physically divided into a first portion disposed on the planarization layer and a second portion disposed on the separating layer by an under-cut structure formed by a step of the sacrifice layer and the separating layer.

The sacrifice layer and the separating layer have different etch selectivity from each other.

The second portion of the first electrode directly contacts the sacrifice layer via the groove.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DESCRIPTION OF EXEMPLARY EMBODIMENTS

Figure 1:
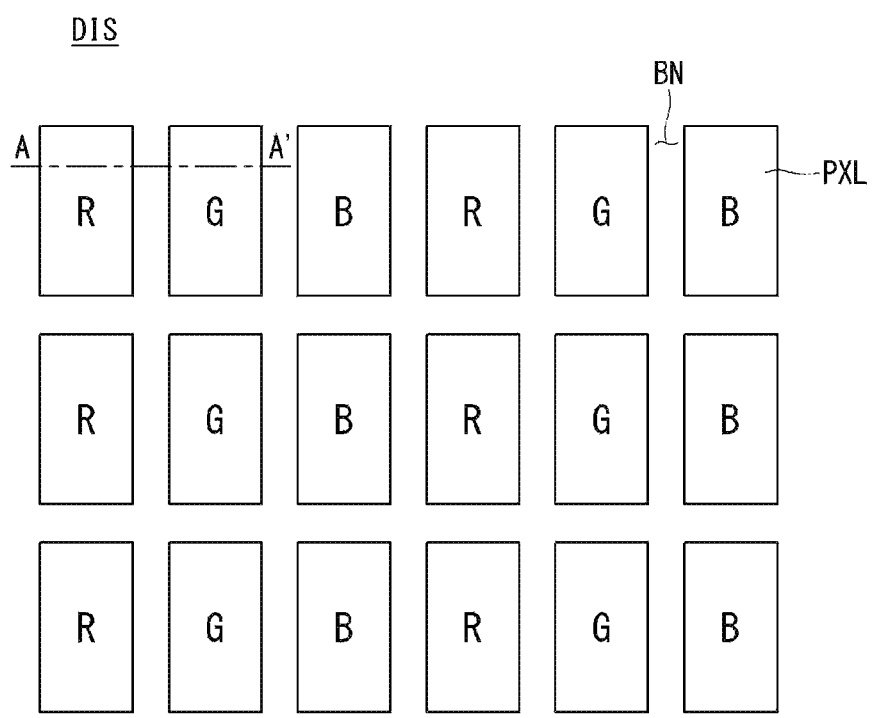
FIGS. 1 and 2 are a plan view and cross-sectional view of an organic light-emitting display.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they may unnecessarily obscure the subject matter of the present invention. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

Figure 2:
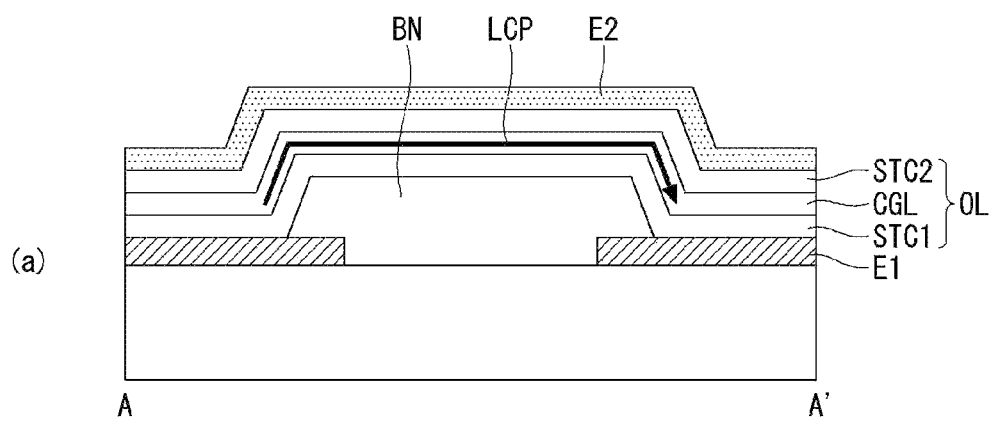
Figure 2:
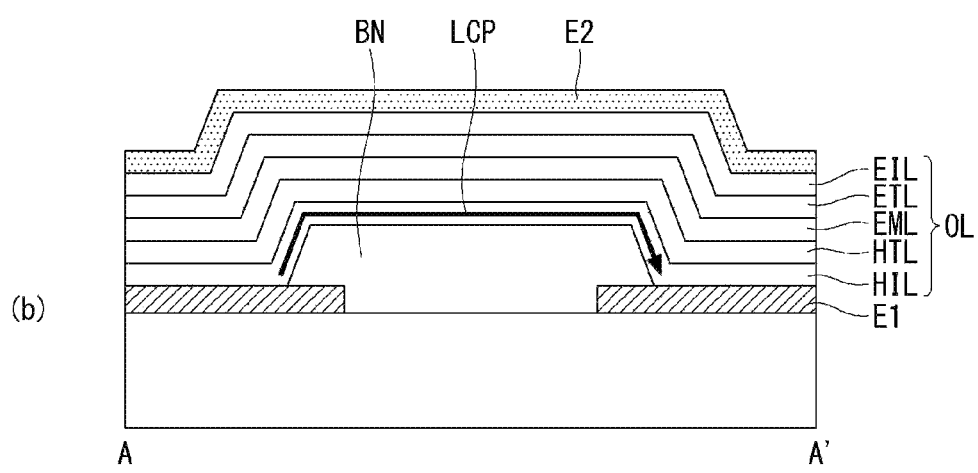

FIGS. 1 and 2 are a plan view and cross-sectional view of an organic light-emitting display.

Referring to FIG. 1, the organic light-emitting display comprises a display panel DIS having a plurality of pixels PXL. The display panel DIS may have various shapes. That is, the plane of the display panel DIS may be rectangular or square, and also may have various free-form shapes, such as a circle, an ellipse, or a polygon.

The display panel DIS comprises red (R), blue (B), and green (G) pixels PXL that emit light red (R), blue (B), and green (G) light, respectively. If required, the display panel DIS may further comprise pixels PXL that emit light of another color, such as white (W). For ease of explanation, a description will be given below with respect to a display panel DIS comprising red (R), blue (B), and green (G) pixels PXL, for example.

The organic light-emitting display according to the present invention comprises an organic compound layer OL that emits white light (W) and red (R), blue (B), and green (G) color filters, in order to produce red (R), blue (B), and green (G) colors. That is, the organic light-emitting display may produce red (R), green (G), and blue (B) colors as the white light (W) emitted from the organic compound layer OL passes through the red (R), blue (B), and green (G) color filters corresponding to the red (R), green (G), and blue (B) pixels PXL.

In the organic light-emitting display according to the present invention, the organic compound layer OL emitting white light (W) is made wide enough to cover most of the entire surface of the panel, so there is no need to use FMM to allocate red (R), blue (B), and green (G) organic compound layers OL to the corresponding pixels PXL, respectively. Thus, the present invention has the advantage of avoiding problems with the use of the aforementioned FMM—for example, a decrease in process yield associated with high resolution and an alignment error which causes displacement of the organic compound layer OL.

Using the aforementioned method, the present invention may provide a display device that minimizes the decrease in process yield and has high resolution. But, the thing is that light may be emitted from unwanted pixels PXL due to a leakage current through the organic compound layer OL, and this may lead to a color mixing defect between neighboring pixels PXL. Here, at least one layer that makes up the organic compound layer OL and has high conductivity may serve as a leakage current flow path LCP (in FIG. 2).

In an example, referring to (a) of FIG. 2, the organic compound layer OL emitting white light (W) may have a multi-stack structure such as a two-stack structure. The two-stack structure may comprise a charge generation layer CGL situated between anode ANO and cathode CAT, and a first stack STC1 and a second stack STC2 that are located under and over the charge generation layer CGL sandwiched between them. In what follows, a description will be given of an example in which the first electrode ANO is an anode and the second electrode CAT is a cathode, but not limited to this example. That is, organic light-emitting diodes may be implemented in an inverted structure.

The first stack STC1 and the second stack STC2 each comprise an emission layer, and may further comprise at least one of common layers such as a hole injection layer, a hole transport layer, an electron transport layer, and an electron injection layer. The emission layer of the first stack STC1 and the emission layer of the second stack STC2 may comprise light-emitting materials of different colors. One of the emission layers of the first stack STC1 and second stack STC2 comprises, but not limited to, a blue light-emitting material, and the other may comprise, but not limited to, a yellow light-emitting material.

Since the aforementioned organic compound layer OL, especially, the charge generation layer CGL, is not patterned into individual parts for each pixel PXL but instead is formed widely, part of the current generated while the display device stays on may leak through the charge generation layer CGL. Due to the leakage current, light is emitted from unwanted pixels PXL, and this results in a significant degradation in color reproduction.

In another example, referring to (b) of FIG. 2, the organic compound layer OL emitting white light (W) may have a single-stack structure. Each single stack comprises an emission layer EML, and may further comprise at least one of common layers such as a hole injection layer HIL, a hole transport layer HTL, an electron transport layer ETL, and an electron injection layer EIL.

Since the aforementioned organic compound layer OL, especially, the hole injection layer HIL, is not patterned into individual parts for each pixel PXL but instead is formed widely to cover all pixels, part of the current generated while the display device stays on may leak through the hole injection layer HIL. Due to the leakage current, light is emitted from unwanted pixels PXL, and this results in a significant degradation in color reproduction range (or color gamut).

The aforementioned problem becomes more severe in high-resolution display devices which have a relatively small pixel pitch. That is, although neighboring pixels PXL are defined by a pixel definition layer BN and spaced by a predetermined pitch, higher-resolution display devices have a much smaller pixel pitch, and therefore the color mixing defect caused by leakage current will occur more often. Hence, there is a need to minimize the flow of leakage current in order to prevent degradation in the display quality of a high-resolution display device.

Figure 3:
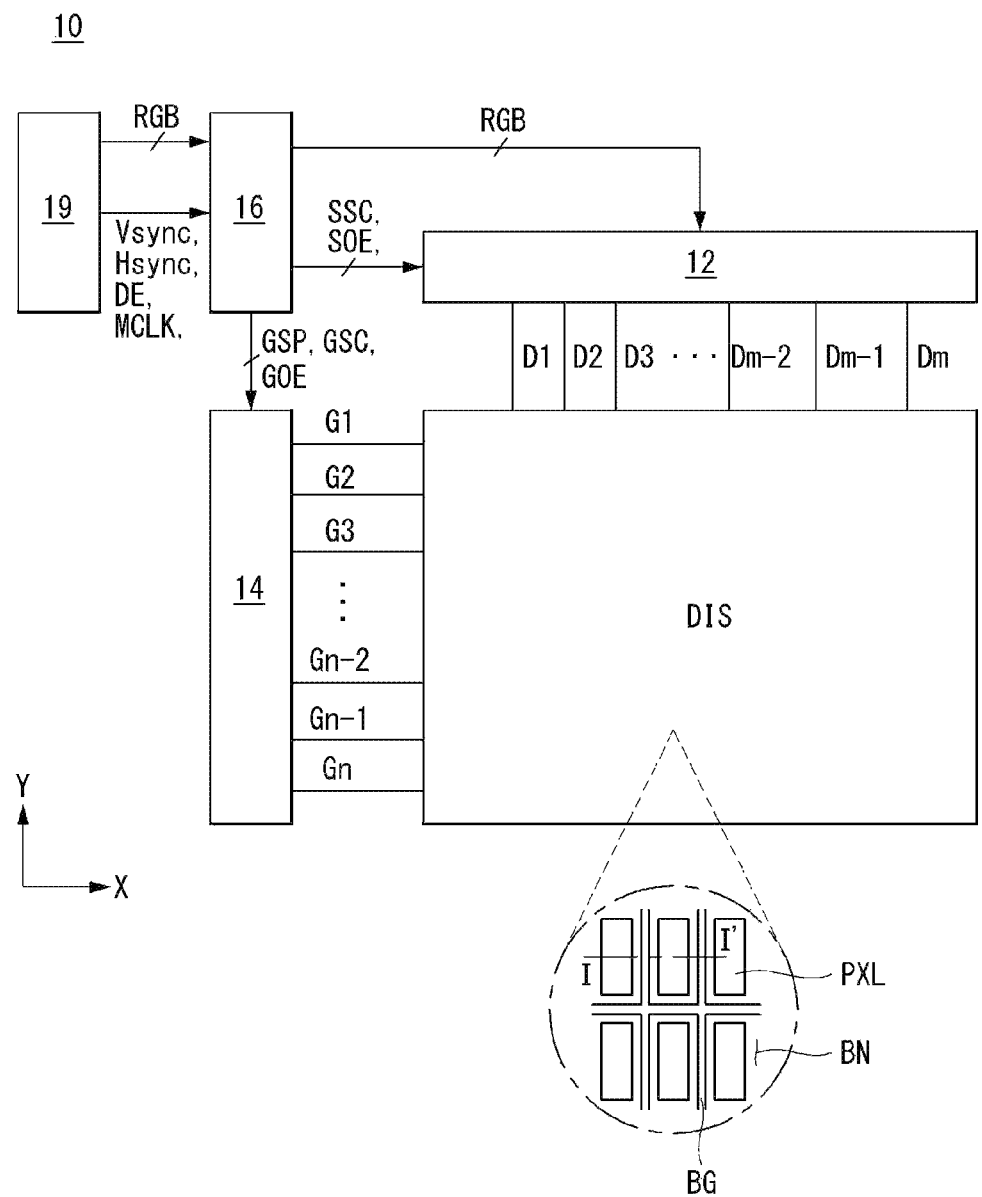
FIG. 3 is a schematic block diagram of an organic light-emitting display according to the present invention.
Figure 4:
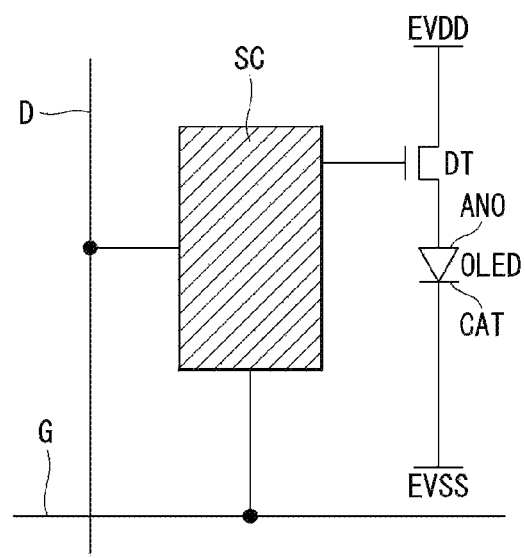
FIG. 4 is a schematic diagram of a pixel shown in FIG. 3.
Figure 5:
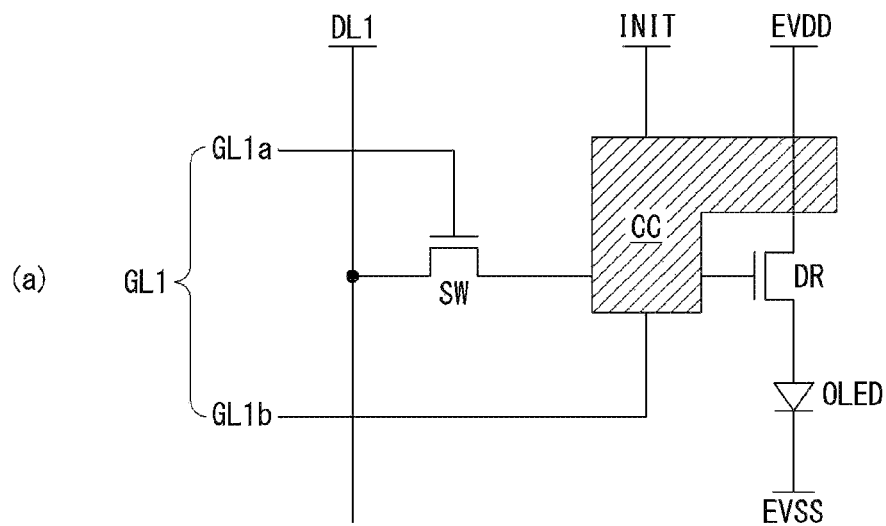
FIG. 5 is diagrams showing concrete examples of FIG. 4.
Figure 5:
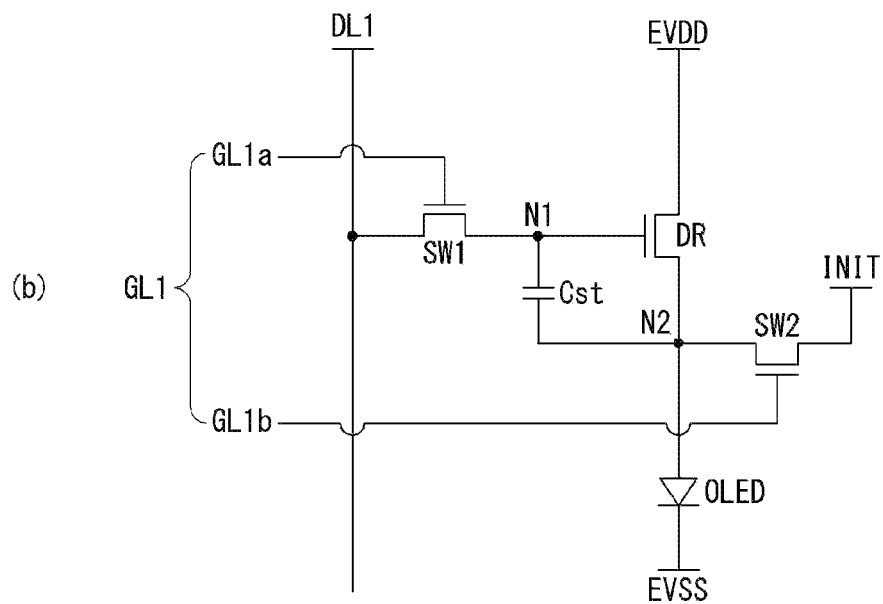
Figure 6:
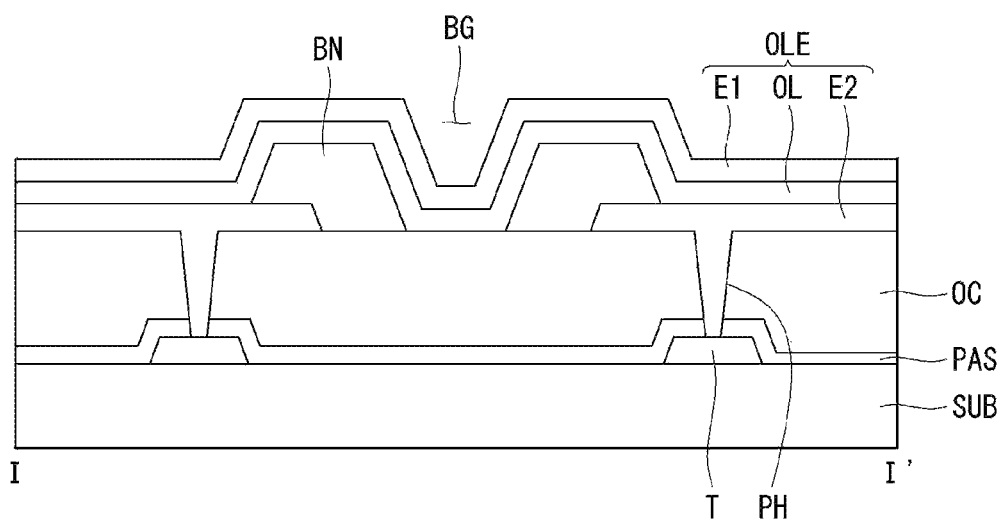
FIG. 6 is a cross-sectional view schematically showing an organic light-emitting display according to the present invention.

FIG. 3 is a schematic block diagram of an organic light-emitting display according to the present invention. FIG. 4 is a schematic diagram of a pixel shown in FIG. 3. FIG. 5 is diagrams showing concrete examples of FIG. 4. FIG. 6 is a cross-sectional view schematically showing an organic light-emitting display according to the present invention.

Referring to FIG. 3, the organic light-emitting display device 10 according to the present invention comprises a display drive circuit and a display panel DIS.

The display drive circuit comprises a data drive circuit 12, a gate drive circuit 14, and a timing controller 16 and writes vides data voltages of an input image to the pixels PXL on the display panel DIS. The data drive circuit 12 converts digital video data RGB inputted from the timing controller 16 into analog gamma-compensated voltages to generate data voltages. The data voltages outputted from the data drive circuit 12 are supplied to data lines D1 to Dm. The gate drive circuit 14 sequentially supplies gate signals to gate lines G1 to Gn in synchronization with the data voltages and selects pixels PXL from the display panel DIS to write the data voltages to.

The timing controller 16 receives, from a host system 19, timing signals such as a vertical synchronization signal Vsync, a horizontal synchronization signal Hsync, a data enable signal DE, and a main clock MCLK, and synchronizes the operation timings of the data drive circuit 12 and gate drive circuit 14 with each other. Data timing control signals for controlling the data drive circuit 12 comprise a source sampling clock (SSC), a source output enable signal (SOE), etc. Gate timing control signals for controlling the gate drive circuit 14 comprise a gate start pulse (GSP), a gate shift clock (GSC), a gate output enable signal (GOE), etc.

The host system 19 may be any one of the following: a television system, a set-top box, a navigation system, a DVD player, a Blu-ray player, a personal computer PC, a home theater system, and a phone system. The host system 19 comprises a system-on-chip (SoC) having a scaler incorporated in it, and converts digital video data RGB of an input image into a format suitable for display on the display panel DIS. The host system 19 sends timing signals Vsync, Hsync, DE, and MCLK, along with the digital video data, to the timing controller 16.

The display panel DIS may have various shapes. That is, the plane of the display panel DIS may be rectangular or square, and also may have various free-form shapes, such as a circle, an ellipse, or a polygon.

The display panel DIS comprises an array of pixels PXL. The array of pixels PXL comprises a plurality of pixels PXL. The pixels PXL may be defined by, but not limited to, the intersections of the data lines D1 to Dm (m is a positive integer) and the gate lines G1 to Gn (n is a positive integer). Each pixel PXL comprises an organic light-emitting diode (hereinafter, OLED) which is a self-luminous element. The display panel DIS comprises red (R), blue (B), and green (G) pixels PXL that emit red (R), green (B), and green (G) light.

The pixels PXL may have various shapes. That is, the plane of the pixels PXL may have various shapes, such as circular, elliptical, or polygonal. One of the pixels PXL may have a different size and/or different planar shape from another.

Referring to FIG. 4, a plurality of data lines D and a plurality of gate lines G intersect on the display panel DIS, and pixels PXL are arranged in a matrix at the intersections. Each pixel PXL comprises an organic light-emitting diode OLED, a driving thin-film transistor DT that controls the amount of current flowing through the organic light-emitting diode OLED, and a programming part SC for setting the gate-source voltage of the driving thin-film transistor DT.

The programming part SC may comprise at least one switching thin-film transistor and at least one storage capacitor. The switching thin-film transistor turns on in response to a gate signal from a gate line G to apply a data voltage from a data line D to one electrode of the storage capacitor. The driving thin-film transistor DT adjusts the amount of light emitted from the organic light-emitting diode OLED by controlling the amount of current supplied to the organic light-emitting diode OLED depending on the level of voltage stored in the storage capacitor. The amount of light emitted from the organic light-emitting diode OLED is proportional to the amount of current supplied from the driving thin-film transistor DT. Such a pixel PXL is connected to a high-level voltage source Evdd and a low-level voltage source Evss to receive high-level power supply voltage and low-level power supply voltage from a power generating part (not shown). The thin-film transistors of the pixel PXL may be implemented as p-type or n-type. Moreover, semiconductor layers of the thin-film transistors of the pixel PXL may contain amorphous silicon, polysilicon, or oxide. A description will be given below with respect to a semiconductor layer that contains oxide. The organic light-emitting diode OLED comprises an anode ANO, a cathode CAT, and an organic compound layer sandwiched between the anode ANO and cathode CAT. The anode ANO is connected to the driving thin-film transistor DT.

As shown in (a) of FIG. 5, a pixel may comprise an internal compensation circuit CC, as well as the aforementioned switching transistor SW, driving transistor DR, capacitor Cst, and organic light-emitting diode OLED. The internal compensation circuit CC may comprise one or more transistors connected to a compensation signal line INIT. The internal compensation circuit CC sets the gate-source voltage of the driving transistor DR to a voltage that reflects variation in threshold voltage, so as to cancel out any brightness variation caused by the threshold voltage of the driving transistor DR when the organic light-emitting diode OLED emits light. In this case, the scan line GL1 comprises at least two scan lines GL1a and GL1b for controlling the switching transistor SW and the transistors in the internal compensation circuit CC.

As shown in (b) of FIG. 5, the pixel may comprise a switching transistor SW1, a driving transistor DR, a sensing transistor SW2, a capacitor Cst, and an organic light-emitting diode OLED. The sensing transistor SW2 is a transistor that may be included in the internal compensation circuit CC, and performs a sensing operation for compensating for the pixel.

The switching transistor SW1 serves to supply a data voltage supplied through the data line DL1 to a first node N1, in response to a scan signal supplied through the first scan line GL1a. The sensing transistor SW2 serves to reset or sense a second node N2 situated between the driving transistor DR and the organic light-emitting diode OLED, in response to a sensing signal supplied through the second scan line GL1b.

The structure of the subpixel according to the present invention is not limited to the above, but may vary, including 2T(transistor)1C(capacitor), 3T1C, 4T2C, 5T2C, 6T2C, and 7T2C.

Referring to FIG. 6, the organic light-emitting display according to the present invention comprises a thin-film transistor substrate SUB. On the thin-film transistor substrate SUB, thin-film transistors T individually and organic light-emitting diodes OLE connected to the thin-film transistors that are allocated to pixel T are placed. Neighboring pixels PXL may be partitioned by a pixel definition layer BN. The planar shape of each pixel PXL may be defined by the pixel definition layer BN. Thus, the position and shape of the pixel definition layer BN may be properly selected so that the pixels PXL have a preset planar shape.

The thin-film transistors T may have various structures, including a bottom-gate structure, a top-gate structure, and a double-gate structure. That is, each thin-film transistor T may comprise a semiconductor layer, a gate electrode, and source/drain electrodes, and the semiconductor layer, gate electrode, and source/drain electrodes may be arranged on different layers, with at least one insulating layer in between.

At least one insulating layer may be interposed between the thin-film transistor T and the organic light-emitting diode OLE. The insulating layer may comprise a planarization layer OC made of an organic material. The planarization layer OC may be made of photoacryl. The planarization layer OC may planarize the surface of a substrate where the thin-film transistor T and various signal lines are formed.

The insulating layer may further comprise a passivation layer PAS composed of a silicon oxide film (SiOx), a silicon nitride film (SiNx), or multiple layers of them, and the passivation layer PAS may be interposed between the planarization layer OC and the thin-film transistor T. The thin-film transistor T and the organic light-emitting diode OLE may be electrically connected via a pixel contact hole PH penetrating one or more insulating layers.

The organic light-emitting diode OLE comprises first and second electrode E1 and E2 facing each other, and an organic compound layer OL interposed between the first electrode E1 and the second electrode E2. The first electrode E1 may be an anode, and the second electrode E2 may be a cathode.

The first electrode E1 may be composed of a single layer or multiple layers. The first electrode E1 further comprises a reflective layer to function as a reflective electrode. The reflective layer may be made of aluminum (Al), copper (Cu), silver (Ag), nickel (Ni), or an alloy of these elements, preferably, APC (silver/palladium/copper alloy). In an example, the first electrode E1 may be formed of triple layers of ITO/Ag/ITO. In this case, the lower ITO may be formed for the purpose of improving the adhesion between the organic layer (planarization layer) and the Ag. The first electrodes E1 may be individually allocated to the pixels— one for each pixel.

A pixel definition layer BN for defining neighboring pixels is located on the substrate SUB where the first electrodes E1 are formed. The pixel definition layer BN may be made of an organic material, preferably, polyimide. The pixel definition layer BN comprises apertures (or openings) for exposing most of the center of the first electrodes E1, respectively. Parts of the first electrodes E1 exposed by the apertures of the pixel definition layer BN may be defined as emitting regions. The pixel definition layer BN may be disposed to expose the center of the first electrodes E1 but cover the side edges of the first electrodes E1.

The pixel definition layer BN comprises grooves BG. The groove BG is disposed between neighboring pixels. In other words, the groove BG is disposed between neighboring apertures.

The grooves BG may function to provide a sufficiently long path of leakage current that can flow to neighboring pixels. That is, the grooves BG formed in the pixel definition layer BN may provide a relatively long flow path of leakage current, because a layer (e.g., charge generation layer) forming the flow path of leakage current is deposited along a stepped portion formed by the grooves BG. Accordingly, the present invention may effectively prevent leakage current and therefore avoid a significant degradation in color reproduction caused by the emission of light from unwanted pixels.

In other words, the present invention may relatively increase the surface area of the layer (e.g., charge generation layer) forming the flow path of leakage current, by having a pixel definition layer BN with grooves BG. That is, the present invention may increase resistance by controlling the surface area of the layer (e.g., charge generation layer) forming the flow path of leakage current. Accordingly, the present invention has the advantage of minimizing the color mixing defect caused by leakage current since the flow of leakage current can be effectively reduced.

In the present invention, in order to increase resistance by controlling the surface area, the number of grooves BG may be properly selected, such as a plurality of grooves BG formed between neighboring pixels, and the width and depth of the grooves BG also may be properly selected. The plurality of grooves BG may be aligned in one direction between pixels that neighboring in that direction. The intervals between the plurality of grooves BG may differ depending on the position.

The groove BG may have the shape of a hole that fully penetrates the entire thickness of the pixel definition layer BN and exposes the underlying layer, or may have the shape of a recess formed by partially recessing the top surface of the pixel definition layer BN inward. Considering the flow path of leakage current, resistance control, etc., it is desirable that the grooves BG have the shape of a hole.

An organic compound layer OL is formed on the substrate SUB where the pixel definition layer BN is formed. The organic compound layer OL is disposed to extend on the thin-film transistor substrate SUB so as to cover the pixels. The organic compound layer OL may have a multi-stack structure such as a two-stack structure. The two-stack structure may comprise a charge generation layer CGL situated between the first electrode E1 and the second electrode E2, and a first stack STC1 and a second stack STC2 that are located under and over the charge generation layer CGL sandwiched between them. The first stack STC1 and the second stack STC2 each comprise an emission layer, and may further comprise at least one of common layers such as a hole injection layer, a hole transport layer, an electron transport layer, and an electron injection layer. The emission layer of the first stack STC1 and the emission layer of the second stack STC2 may comprise light-emitting materials of different colors.

The second electrode E2 is formed on the substrate SUB where the organic compound layer OL is formed. The second electrode E2 may be made of a transparent conductive material such as ITO (indium tin oxide), IZO (indium zinc oxide), or ZnO (zinc oxide), or may be made of a thin opaque conductive material such as magnesium (Mg), calcium (Ca), aluminum (Al), or silver (Ag) and function as a transmissive electrode. The second electrode E2 may integrally extend on the thin-film transistor substrate SUB so as to cover the pixels.

The present invention may minimize the problem of light emission from unwanted pixels caused by leakage current because the leakage current flowing to neighboring pixels can be effectively reduced. Thus, the present invention provides an organic light-emitting display which significantly improves display quality.

Embodiment

Figure 7:
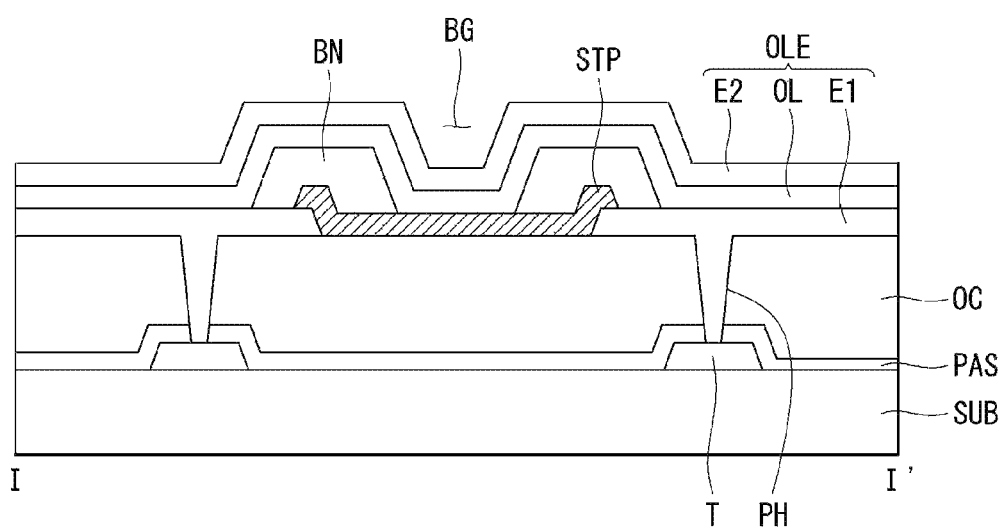
FIG. 7 is a cross-sectional view schematically showing an organic light-emitting display according to an exemplary embodiment of the present invention.
Figure 8:
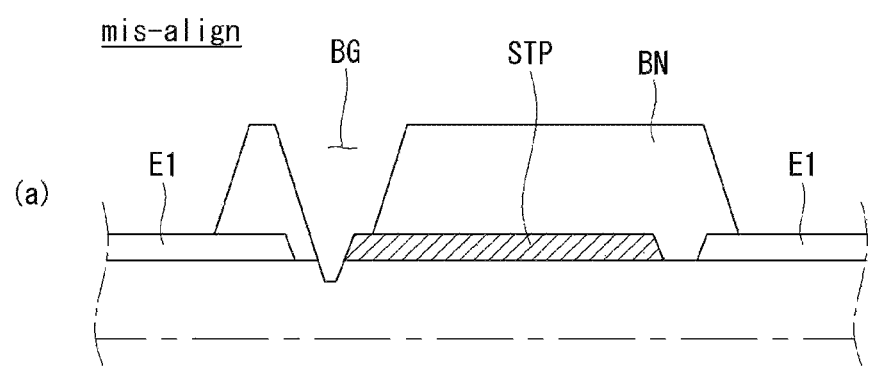
FIG. 8 is a view for explaining the positional relationship of a stopper.
Figure 8:
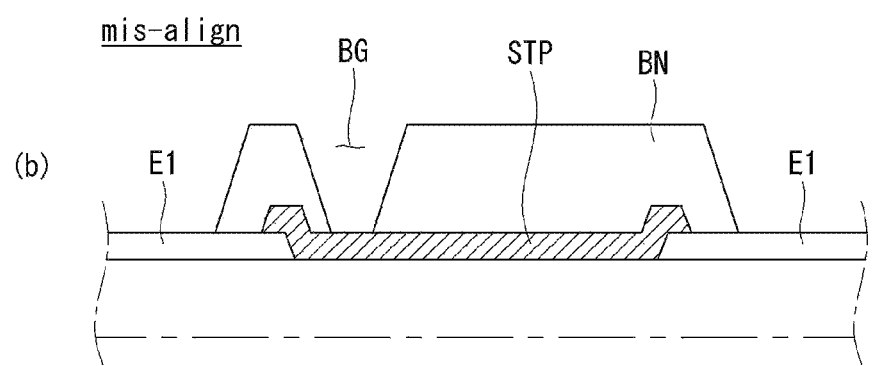

FIG. 7 is a cross-sectional view schematically showing an organic light-emitting display according to an exemplary embodiment of the present invention. FIG. 8 is a view for explaining the positional relationship of a stopper.

An organic light-emitting display according to a first exemplary embodiment of the present invention comprises a thin-film transistor substrate SUB. Thin-film transistors T respectively corresponding to the pixels and organic light-emitting diodes OLE connected to the thin-film transistors T are placed on the thin-film transistor substrate SUB. The organic light-emitting diode OLE comprises a first electrode E1, a second electrode E2, and an organic compound layer OL interposed between the first electrode E1 and the second electrode E2.

Neighboring pixels may be defined by a pixel definition layer BN, and the planar shape of each pixel PXL may be defined by the pixel definition layer BN. Thus, the position and shape of the pixel definition layer BN may be properly selected in order to form pixels PXL having a preset planar shape.

The pixel definition layer BN comprises grooves BG. The grooves BG need to be formed at a preset depth or deeper, because they function to provide a sufficient flow path of leakage current. The preset depth refers to a minimum depth required for the grooves BG to function properly. However, the grooves BG may not have a uniform depth but may have different depths depending on their location, due to limitations on the process. In this case, the grooves BG may not be formed at the preset depth in at least one region, which may be a problem.

To prevent this problem, the grooves BG may be formed at a sufficient depth greater than the preset depth. In this case, the grooves BG may have a sufficient depth and perform their function at all locations. However, when even the planarization layer OC underlying the pixel definition layer BN is etched in an etching process for forming the grooves BG, an out-gas produced from a pigment forming the planarization layer OC may enter the organic compound layer OL through the grooves BG, thereby leading to device deterioration.

To prevent this, the organic light-emitting display according to the first exemplary embodiment of the present invention further comprises a stopper STP. The stopper STP is interposed between the pixel definition layer BN and the planarization layer OC, and overlaps the grooves BG. The stopper STP is located at positions corresponding to the grooves BG, and functions to prevent an etching solution from flowing into the planarization layer OC in the etching process for forming the grooves BG.

The stopper STP and the pixel definition layer BN have different etch selectivity from each other. That is, the material of the stopper STP may be a material that allows the etch rate of the stopper STP to be set lower than the etch rate of the pixel definition layer BN under the same process condition. For example, the stopper STP may be composed of a single layer of inorganic material such as a silicon oxide film (SiOx), a silicon nitride film (SiNx), a silicon oxynitride (SiON), aluminum oxide (Al2O3), and titanium dioxide (TiO2) or multiple layers thereof. For example, an etching process using O2 plasma may be carried out to form the grooves BG. If the stopper STP is made of the aforementioned inorganic material, it may function as a means for controlling the degree of etching of the pixel definition layer BN because it is not etched by O2 plasma.

In the first exemplary embodiment of the present invention, the stopper STP may be used to control the degree of etching of the pixel definition layer BN so as to prevent the pixel definition layer BN from being etched to more than a preset depth in the etching process for forming the grooves BG. Thus, the grooves BG may be formed at a preset depth or deeper at all locations. In other words, in the first exemplary embodiment of the present invention, even if the grooves BG have different depths depending on their location, the grooves BG may have a preset depth or deeper at all locations by overetching. At the same time, the first exemplary embodiment of the present invention may prevent device deterioration caused by an out-gas because the stopper STP keeps the planarization layer OC from being etched even if overetching is performed.

The organic compound layer OL and the second electrode E2 is sequentially stacked on the pixel definition layer BN with the grooves BG and on the first electrodes E1. The organic compound layer OL may make direct contact with the stopper STP via the grooves BG.

Referring to FIG. 8, the stopper STP is placed between the first electrodes E1 of neighboring pixels. The stopper STP may be spaced a predetermined distance apart from the first electrode E1 or may make contact with it.

If the stopper STP is spaced a predetermined distance apart from the first electrode E1, the planarization layer OC is exposed between the stopper STP and the first electrode E1. In this case, if the groove BG is not formed at preset locations due to a process defect, this may lead to the problem of etching the exposed planarization layer OC by the etching solution ((a) of FIG. 8).

To prevent this, it is desirable that the stopper STP is disposed to make contact with the sides of the first electrodes E1 of the neighboring pixels or to cover at least one side surface and at least a part of top surface of the first electrodes E1. In this case, the planarization layer OC is not exposed due to the stopper STP. Thus, even if an alignment error occurs in the formation of the grooves BG, this may prevent the problem of an out-gas produced from the etching of the planarization layer OC ((b) of FIG. 8).

Application Example

Figure 9:
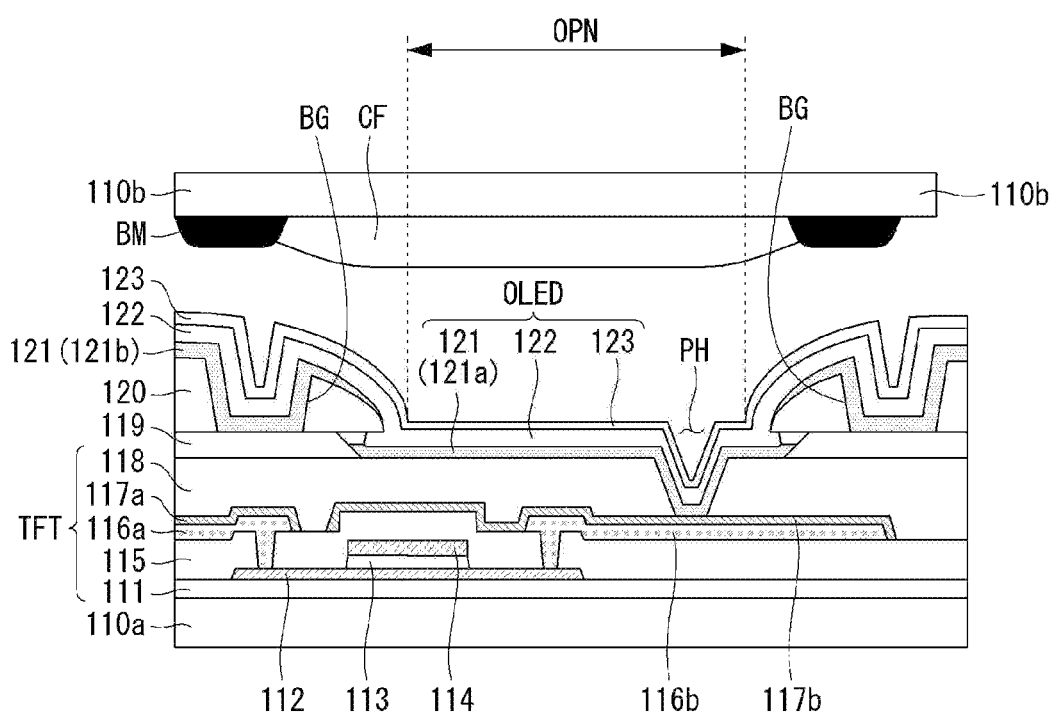
FIG. 9 is a cross-sectional view schematically showing an organic light-emitting display according to an application example of the present invention.

FIG. 9 is a cross-sectional view schematically showing an organic light-emitting display according to an application example of the present invention.

Referring to FIG. 9, the organic light-emitting display according to the application example of the present invention comprises a lower substrate 110a and an upper substrate 110b that face each other. The lower substrate 110a comprises thin-film transistors TFT and organic light-emitting diodes OLED connected to the transistors TFT. The upper substrate 110b may comprise color filters CF, and, if necessary, may further comprise a black matrix BM.

A buffer layer 111 lies on the lower substrate 110a. The buffer layer 111 may be composed of a single layer of silicon nitride (SiNx) or silicon oxide (SiOx) or multiple layers of silicon nitride (SiNx) and silicon oxide (SiOx). Meanwhile, a light blocking layer made of a metal material may be located between the lower substrate 110a and the buffer layer 111 to block external light. The light blocking layer may be disposed to correspond to the semiconductor layer (or channel region) of the transistors.

A semiconductor layer 112 lies on the buffer layer 111. The semiconductor layer 112 has a source region, a channel region, and a drain region. The semiconductor layer 112 may be made of an organic semiconductor material, an oxide semiconductor material, or a silicon semiconductor material.

A gate insulating layer 113 lies on the semiconductor layer 112. The gate insulating layer 113 is formed to cover the channel region of the semiconductor layer 112. The gate insulating layer 113 may be composed of a single layer of silicon nitride (SiNx) or silicon oxide (SiOx) or multiple layers of silicon nitride (SiNx) and silicon oxide (SiOx).

A gate metal layer 114 lies on the gate insulating layer 113. The gate metal layer 114 corresponds to the size of the gate insulating layer 113. The gate metal layer 114 serves as gate electrodes of the transistors TFT. Besides, the gate metal layer 114 is used as a layer that forms scan lines or the like. The gate insulating layer 113 may be one selected from the group consisting of molybdenum (Mo), aluminum (Al), chrome (Cr), gold (Au), titanium (Ti), nickel (Ni), and copper (Cu) or an alloy thereof, and may be composed of a single layer or multiple layers.

An interlayer insulating layer 115 lies on the gate metal layer 114. The interlayer insulating layer 115 may be composed of a single layer of silicon nitride (SiNx) or silicon oxide (SiOx) or multiple layers of silicon nitride (SiNx) and silicon oxide (SiOx). The interlayer insulating layer 115 exposes the source and drain regions of the semiconductor layer 112.

A source electrode 116a and a drain electrode 116b lie on the interlayer insulating layer 115. The source electrode 116a and the drain electrode 116b are connected respectively to the source and drain regions of the semiconductor layer 112 via contact holes penetrating the interlayer insulating layer 115. The source electrode 116a and the drain electrode 116b may be one selected from the group consisting of molybdenum (Mo), aluminum (Al), chrome (Cr), gold (Au), titanium (Ti), nickel (Ni), and copper (Cu) or an alloy thereof, and may be composed of a single layer or multiple layers.

A cover layer 117a and 117b lies on the source electrode 116a and the drain electrode 116b. The cover layer 117a and 117b is patterned, corresponding to the positions of the source electrode 116a and the drain electrode 116b, so as to protect the source electrode 116a and the drain electrode 116b. The cover layer 117a and 117b may be made of an oxide such as ITO (indium tin oxide) and IZO (indium zinc oxide).

The cover layer 117a and 117b may be divided into a first cover layer 117a that makes contact with the source electrode 116a and a second cover layer 117b that makes contact with the drain electrode 116b, which may be separated from each other. At least one of the first and second cover layers 117a and 117b may extend to overlap the channel region.

The cover layer 117a and 117b may be omitted or replaced with a passivation layer due to the characteristics of the process. The passivation layer may be composed of a single layer of silicon nitride (SiNx) or silicon oxide (SiOx) or multiple layers of silicon nitride (SiNx) and silicon oxide (SiOx).

A planarization layer 118 lies on the cover layer 117a and 117b. The planarization layer 118 functions to planarize the surface of the underlying structure comprising the transistors TFT, and may be made of an organic material such as photoacryl, polyimide, benzocyclobutene resin, or acrylate resin. Pixel contact holes PH are formed in the planarization layer 118. The pixel contact holes PH expose part of the drain electrode 116b or second cover layer 117b, within open regions OPN defining the emitting regions of the pixels.

A sacrifice layer 119 lies on the planarization layer 118. The sacrifice layer 119 has wider aperture (or first opening) than the open region OPN defining the emitting regions of the pixels. The sacrifice layer 119 exposes part of the planarization layer 118 via aperture that is wider than the open regions OPN. The sacrifice layer 119 may be composed of a single layer of inorganic material such as a silicon oxide film (SiOx), a silicon nitride film (SiNx), a silicon oxynitride (SiON), aluminum oxide (Al2O3), and titanium dioxide (TiO2) or multiple layers thereof. The sacrifice layer 119 may function as a stopper STP (see FIG. 7) capable of controlling the degree of etching of the grooves to be formed later.

A separating layer 120 lies on the sacrifice layer 119. The separating layer 120 may define the open regions OPN defining the emitting regions of the pixels. Thus, the separating layer 120 may be referred to as a pixel definition layer. Here, the open region OPN may be referred to as a second opening. The separating layer 120 exposes part of the planarization layer 118 via the open regions OPN. The separating layer 120 may be made of a silicon material, for example, siloxane. An under-cut structure is formed by the difference in area between the open regions OPN in the separating layer 120 and the apertures in the sacrifice layer 119.

Grooves BG are formed in the separating layer 120. The grooves BG expose at least part of the sacrifice layer 119. The sacrifice layer 119 is not penetrated but left when the grooves BG are formed, because the sacrifice layer 119 is made of a material that has a different etch selectivity from the material of the separating layer 120.

First electrode s121 lie on the separating layer 120. The first electrodes 120 cover both the planarization layer 118 and the separating layer 120.

Due to the under-cut structure formed by a step of the sacrifice layer 119 and the separating layer 120, each first electrode 121 has a first portion 121a overlying the planarization layer 118 and a second portion 121b overlying the separating layer 120 which are electrically separated from each other. That is, each first electrode 121 is self-pixelated by the under-cut structure, and is therefore divided into a second portion 121b present on the separating layer 120 and a first portion 121a present on the planarization layer 118 exposed via the open region OPN, which are electrically and physically disconnected.

The first portion 121a of each first electrode 121 that overlies the planarization layer 118 is electrically connected to a part of the drain electrode 116b or second cover layer 117b via the pixel contact hole PH in the planarization layer 118. The second portion 121b of each first electrode 121 that overlies the separating layer 120 is formed along the stepped portion of the groove BG and may make direct contact with the sacrifice layer 119 via the groove BG.

Accordingly, the application example of the present invention has the advantage of significantly improving process yield, since there is no need to perform a patterning process for allocating the first electrodes 121 individually to the pixels. Moreover, the application example of the present invention allows the first electrode 121 overlying the separating layer 120 to reflect the light emitted from the organic compound layer 122 toward the color filters on the upper substrate 101b. Therefore, light efficiency can be significantly improved.

The organic compound layer 122 lies on the first electrodes 121. The organic compound layer 122 may be made of a material that emits white light. The organic compound layer 122 covers both the first electrodes 121 and the separating layer 120, and is formed along the under-cut structure formed by the sacrifice layer 119 and separating layer 120 and the stepped portions of the grooves BG.

Second electrode 123 lie on the organic compound layer 122. The second electrode 123 covers the organic compound layer 122, and are formed along the stepped portions of the grooves BG.

Color filters CF are located on the upper substrate 110b. Each color filter CF comprises a pigment that can convert the light generated from the organic compound layer 122 into either red, green, or blue light. A black matrix BM may be located on the upper substrate 110b. The black matrix BM may be located between neighboring color filters CF in order to prevent light leakage at the boundaries (non-open regions) between the pixels and prevent a color mixing defect between the color filters CF. The black matrix BM may comprise a black pigment.

In the present invention, leakage current can be effectively prevented by forming grooves in the pixel definition layer, thereby preventing the problem of a significant degradation in color reproduction caused by the emission of light from unwanted pixels. Thus, the present invention has the advantage of providing an organic light-emitting display which significantly improves display quality.

In the present invention, it is possible to prevent an etching solution from flowing into the planarization layer in the etching process for forming the grooves, by comprising a stopper capable of controlling the depth of the grooves. Therefore, the problem of device deterioration caused by an out-gas produced from the etching of the planarization layer may be minimized.

Through the above description, those skilled in the art will appreciate that various modifications and changes are possible, without departing from the scope and spirit of the invention. Therefore, the technical scope of the present invention should be defined by the appended claims rather than the detailed description of the specification.

What is claimed is:

1. An organic light-emitting display having pixels, comprising:
    a planarization layer disposed on transistors;
    first electrodes disposed on the planarization layer and individually allocated to the pixels;
    a stopper disposed on the planarization layer and placed between the first electrodes neighboring each other; and
    a pixel definition layer that has apertures exposing respectively at least a part of the first electrodes and grooves exposing at least a part of the stopper,
    an organic compound layer covering the first electrodes and the pixel definition layer; and
    a second electrode covering the organic compound layer,
    wherein the pixel definition layer directly contacts the stopper and the first electrodes, and
    wherein the organic compound layer directly contacts the stopper via the grooves.

2. The organic light-emitting display of claim 1, wherein the stopper directly contacts one side of the first electrode.

3. The organic light-emitting display of claim 1, wherein the stopper covers one side surface and at least a part of a top surface of the first electrode.

4. The organic light-emitting display of claim 1, wherein the stopper and the pixel definition layer have a different etch selectivity from each other under an etching process condition using $O_2$ plasma.

5. The organic light-emitting display of claim 1, wherein the stopper includes a material having an etching rate which is lower than an etching rate of the pixel defining layer under an etching process condition using $O_2$ plasma.

6. The organic light-emitting display of claim 1, wherein the stopper includes at least one inorganic material layer.

7. The organic light-emitting display of claim 6, wherein the at least one inorganic material layer is one of
    a silicon oxide layer (SiOx),
    a silicon nitride layer (SiNx),
    a silicon oxynitride layer (SiON),
    an aluminum oxide layer (Al2O3), and
    a titanium dioxide layer (TiO2).

8. An organic light-emitting display comprising:
    a planarization layer disposed on transistors;
    a sacrifice layer that has a first opening exposing at least a part of the planarization layer;
    a separating layer that is disposed on the sacrifice layer, has a second opening narrower than the first opening, and has a groove exposing at least a part of the sacrifice layer; and
    a first electrode disposed on the planarization layer, the separating layer, and the grooves,
    wherein the first electrode is physically divided into a first portion disposed on the planarization layer and a second portion disposed on the separating layer by an under-cut structure formed by a step of the sacrifice layer and the separating layer;
    wherein the separating layer is between the sacrifice layer and the second portion of the first electrode, and
    wherein the second portion of the first electrode directly contacts the sacrifice layer via the grooves.

9. The organic light-emitting display of claim 8, wherein the sacrifice layer and the separating layer have a different etch selectivity from each other under an etching process condition using $O_2$ plasma.

* * * * *